Figure 1:
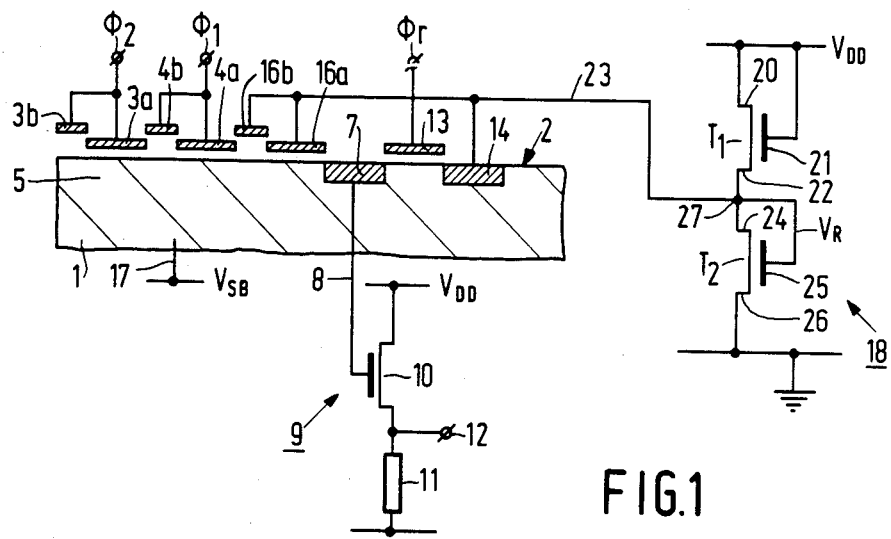

United States Patent [19]

Pelgrom et al.

[11] Patent Number: 4,627,083

[45] Date of Patent: Dec. 2, 1986

[54] CHARGE TRANSFER DEVICE OUTPUT

[75] Inventors: Marcellinus J. M. Pelgrom; Jan W. Slotboom, both of Eindhoven, Netherlands

[73] Assignee: U.S. Philips Corporation, New York, N.Y.

[21] Appl. No.: 841,907

[22] Filed: Mar. 20, 1986

[30] Foreign Application Priority Data

Mar. 25, 1985 [NL] Netherlands ............... 8500863

[51] Int. Cl.$^4$ .................. G11C 19/28; H01L 29/78
[52] U.S. Cl. ............................. 377/60; 357/24
[58] Field of Search ............ 357/24; 377/57–63

[56] References Cited

U.S. PATENT DOCUMENTS

| | | | |
|---|---|---|---|
| 4,060,737 | 11/1977 | Gosney | 377/60 |
| 4,093,872 | 6/1978 | Hartman et al. | 357/24 |
| 4,242,600 | 12/1980 | Hoffman et al. | 377/58 |
| 4,255,673 | 3/1981 | Knauer | 377/58 |
| 4,280,067 | 7/1981 | Kohyama | 377/58 |
| 4,584,697 | 4/1986 | Hazendonk et al. | 377/60 |

Primary Examiner—Gene M. Munson
Attorney, Agent, or Firm—Thomas A. Briody; William J. Streeter; Marianne R. Rich

[57] ABSTRACT

The invention relates to a charge-coupled device, in which the reset transistor of the output is clocked—with a positive threshold voltage—by a maximum voltage equal to the supply voltage $V_{DD}$. The drain (14) of the reset transistor is adjusted by means of an auxiliary transistor ($T_1$) controlled by a current source ($T_2$) and having the same threshold voltage, whose gate (21) is applied to $V_{DD}$ and whose source (22) is connected to the drain (14) of the reset transistor. Due to the fact that the maximum gate voltage is equal to $V_{DD}$, additional voltage sources, such as charge pumps, for generating voltages higher than $V_{DD}$ are superfluous.

5 Claims, 4 Drawing Figures

CHARGE TRANSFER DEVICE OUTPUT

The invention relates to a charge transfer device comprising a semiconductor body, at a surface of which is defined a charge transport channel for storing and transporting information in the form of discrete charge packets to an output stage, which has a zone for temporarily storing and reading the charge packets and an insulated gate field effect transistor which forms a reset transistor for draining a read charge packet and preparing the said zone for storing and reading a next charge packet, this transistor comprising a source region coupled to the said zone, an insulated gate connected to a clock voltage source for rendering the transistor intermittently conducting and non-conducting, and a drain region connected to means for applying a suitable drain voltage. Such a device is known inter alia from "Charge Transfer Devices" of C. H. Sequin and M. F. Tompsett, Academic Press Inc., 1975, FIG. 3.14b, p. 53 and the associated description. The invention will be explained in the following description with reference to an n-channel surfaace device, but it will be appreciated that the invention may also be used for p-channel devices and for devices of the buried channel type.

As usual such a charge transfer device comprises a p-type silicon substrate, which is provided at the surface with a clock electrode system, which is separated from the semiconductor material by a thin insulating layer. When suitable clock voltages are applied to the clock electrodes, as is known, charge packets consisting of electrons can be passed through the charge transport channel to the reading zone. This zone is constituted by an n+ surface zone, which is provided by diffusion or implantation in the semiconductor body at the end of the row of clock electrodes. When a charge packet is stored in the zone, this leads to a voltage variation which can be detected by means of an amplifier also integrated in the semiconductor body. Thus, each charge packet can be read out in a non-destructive manner. The reset transistor serves to apply the n+ zone to a suitable positive potential before a new charge packet is supplied. This potential should be sufficiently positive so that the maximum charge packet can be stored entirely in the n+ zone. For this purpose, it is usual to apply the drain of the reset transistor to the highest voltage available, i.e. the supply voltage $V_{DD}$, which generally amounts to +5 V. If, as usual, the reset transistor is of the enhancement type, i.e. of a type in which a positive voltage of more than 0 V is required at the gate electrode to render the transistor conducting, a gate voltage of more than 5 V is required to reset the said n+ reading zone, which constitutes the source of the reset transistor, to the supply voltage of 5 V. A specific value for the gate voltage is 8 V. Since the supply voltage is only 5 V, separate circuits, for example a charge pump, are required for this high gate voltage.

If it should be possible to use a reset transistor of the depletion type, i.e. a transistor which is conducting already with 0 V at the gate electrode, the reset transistor could be operated with a clock voltage equal to the supply voltage. However, it has been found that these transistors often do not provide a sufficient insulation between the source and drain regions, even if a negative voltage is applied to the gate electrode. This may be explained as follows: In order to render the transistor nonconducting, a negative voltage has to be applied to the gate electrode which is so large that all electrons are removed from the implanted n-type channel between source and drain. However, it is possible that, before the n-type channel regions has completely been depleted, accumulation of holes occurs at the surface. If the voltage at the gate electrode is further reduced, this will no longer influence the non-depleted part of the implanted channel, as a result of which a leakage path remains between source and drain. Since with a very small leakage current of 1 nA already a loss of charge of 10% may occur, the use of field effect transistors of the depletion type as a reset transistor is practically excluded.

The invention has inter alia for its object, whilst using a field effect transistor of the enhancement type, to avoid high gate voltages. The invention is based inter alia on the recognition of the fact that the gate electrode of the reset transistor can be clocked with a voltage equal to the supply voltage by reducing the potential at the drain of the reset transistor to a value lower than the supply voltage.

A charge transfer device according to the invention is characterized in that the said means comprise a second insulated gate field effect transistor, which is designated hereinafter as auxiliary transistor, whose gate and drain can be applied to a fixed voltage $V_1$, more particularly the supply voltage, and whose source is connected to the drain region of the reset transistor and to current supply means for passing a current through the auxiliary transistor, and in that the gate of the reset transistor is connected to a clock voltage source, by means of which in the conductive state of the reset transistor the voltage $V_1$ is also applied to the gate of the reset transistor.

The voltage of the source of the auxiliary field effect transistor provides for the reduced reset voltage which is applied to the drain of the reset transistor. Since the auxiliary transistor is conducting with a gate voltage equal to the supply voltage, the reset transistor will also be conducting with a gate voltage equal to the supply voltage. Preferably, the channel regions of the reset transistor and the auxiliary transistor have at least practically the same dimensions in order to obtain at least practically equal threshold voltages.

In charge transfer devices of the type described herein, there is generally arranged between the output stages and the clock electrodes a blocking gate, which during operation is applied to a fixed voltage and serves to avoid cross-talk of the clock voltages to the reading zone. The voltage applied to this zone should be such that below this electrode is induced a potential barrier which on the one hand is sufficiently low to transfer charge from below the last clock electrode to the reading zone and on the other hand is so high that a maximum charge packet can be entirely stored in the reading zone and is not partially stored below the blocking gate. A preferred embodiment, in which a potential barrier of suitable height is obtained below the blocking gate also at the reduced voltage at the drain (and hence source), is characterized in that there is arranged above the charge transport channel, viewed in the charge transport direction, in front of the said zone of the output stage an insulated gate, which is connected to the source of the auxiliary field effect transistor.

Figures 2, 4:
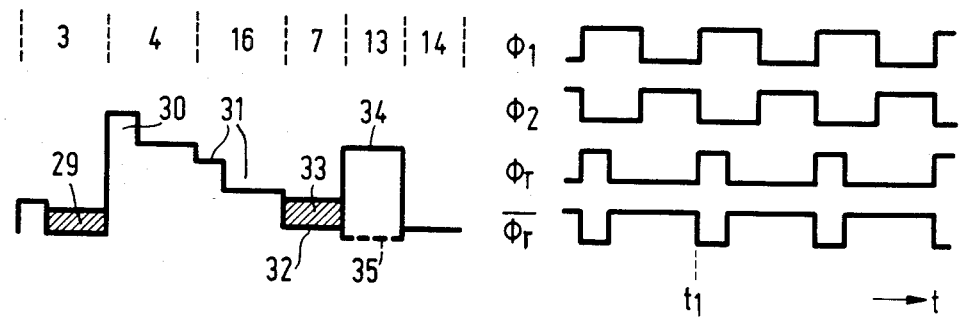
Figure 3:
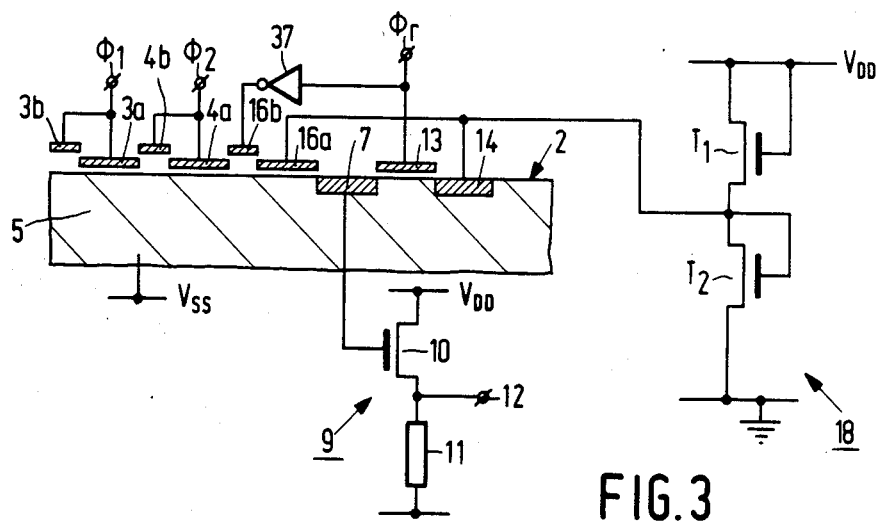

The invention will now be described more fully with reference to a few embodiments, by way of example, and the accompanying diagrammatic drawing, in which:

FIG. 1 shows diagrammatically a part of a charge coupled device in accordance with the invention comprising the output stage, FIG. 2 shows a potential distribution in the device shown in FIG. 1 induced in the channel during operation, FIG. 3 shows diagrammatically a second embodiment of a charge coupled device in accordance with the invention, FIG. 4 shows a diagram of the clock voltages applied to the device shown in FIG. 3.

FIG. 1 shows diagrammatically a part of a charge transfer device in accordance with the invention, i.e. the part comprising the output stage and the last two clock electrodes in front of the output stage. The device is provided in a p-type silicon body 1 having the usual thickness and composition, in which a charge transport channel 5 is defined. The body 1 is provided at the surface 2 with an electrode system which is insulated from the surface 2 by an insulating layer (not shown) of, for example, silicon oxide and/or silicon nitride. Of the electrode system the last two clock electrodes 3 and 4 are shown, which comprise a storage part 3a and 4a, respectively, and a transfer part 3b and 4b, respectively. The transfer parts 3b, 4b, which are provided on a slightly thicker oxide layer than the storage parts 3a, 4a, serve to induce a potential barrier in the semiconductor body and thus to operate the device, as is known, as a two-phase surface CCD. The electrode 3 is controlled by a clock voltage $\phi_2$, while the electrode 4 is controlled by a clock voltage $\phi_1$. Of course, the invention is not limited to this case, but may also be used in three- or four- or multiphase CCD's, BBD's or in CCD's of the buried channel type. Moreover, it will be clear that besides the clock electrodes 3 and 4, the device may comprise a large number of further clock electrodes, which are arranged in a row in front of the electrodes 3 and 4.

There is situated behind the last clock electrode the output stage having an n+ zone 7, in which the transported charge (electron packets) can be temporarily stored in order to be read out. For this purpose, the n+ zone is connected via the connection 8 shown diagrammatically to an output amplifier 9, which is constituted in the present embodiment, by way of example, by a source follower comprising a field effect transistor 10. The gate of this transistor is connected via the conductor 8 to the n+ zone 7. The drain of the transistor 10 is connected to the supply voltage $V_{DD}$. The source is connected via the resistor 11 to earth. Through the output terminal 12, the amplified output signal can be derived at the source of the transistor 10.

In order to reset the n+ zone 7 each time to a reference level, the output stage is provided with a reset transistor having an insulated gate 13, a drain in the form of an n+ zone 14 and a source constituted by the zone 7. The gate electrode 13 is driven by a clock voltage $\phi_r$.

There is arranged between the zone 7 and the last clock electrode 4 an additional gate 16, also designated as output gate (OG), which is applied to a fixed potential. This output gate serves to prevent cross-talk of the clock voltages applied to the clock electrodes 3, 4 to the zone 7. The construction of the output gate 16 is identical to that of the clock electrodes 3, 4, a part 16a being provided on thinner oxide and a part 16b being provided on thicker oxide.

The semiconductor body may further be provided, for example, on the back side with a connection 17 for applying a suitable substrate voltage $V_{SB}$.

In contrast with what is usual, i.e. connecting the drain 14 of the reset transistor to the highest voltage, i.e. the supply voltage $V_{DD}$, a lower voltage is applied to the drain. As a result, the gate 13 can be controlled by a voltage equal to the supply voltage, while circuits, which are otherwise necessary to generate a voltage higher than the supply voltage, can be avoided. The reset voltage $V_R$ is generated by the circuit 18, which mainly comprises only a series-combination of two insulated gate field effect transistors $T_1$ and $T_2$. The transistor $T_1$ comprises a drain 20 and a gate 21, which are both applied to the positive supply voltage $V_{DD}$, and a source 22, which is connected to the drain 14 of the reset transistor through the connection 23. The transistor $T_1$ is supposed to have the same or at least substantially the same threshold voltage as the reset transistor 7, 13, 14. Therefore, the length/width dimensions of the transistor $T_1$ are equal to the length/width dimensions of the reset transistor in order to avoid that due to so-called small channel effects the threshold voltages are different. When a current of the suitable value is passed through the transistor $T_1$, the source 22 of the transistor $T_1$ is adjusted to the desired reset voltage $V_R$, which is lower than the supply voltage $V_{DD}$. Due to the fact that moreover the threshold voltage of the transistor $T_1$ and the reset transistor are equal or at least substantially equal, the value of the reset voltage $V_R$ is always such that, when the reset transistor is controlled by a clock voltage equal to the supply voltage $V_{DD}$, the reset transistor is conducting so that the source 7 of the reset transistor can be reset accurately to the voltage $V_R$.

For adjusting the current, $T_1$ is connected to a second transistor $T_2$, whose drain 24 is connected to the source 22 of $T_1$, whose gate 25 is connected to the source 22 of $T_1$ and whose source 26 is connected to the negative supply or earth.

During operation, a substrate voltage $V_{SB}$ of, for example, $-2.5$ V is applied to the p-type substrate 1. Clock voltages $\phi_1$, $\phi_2$ having a high level of, for example, 5 V equal to the supply voltage $V_{DD}$ and a low level of 0 V are applied to the clock electrodes 3, 4 and to the gate 13 of the reset transistor. The potential at the node 27 between $T_1$ and $T_2$ and hence the potential at the zone 14 and the blocking gate 16 can be adjusted in a simple manner by suitably proportioning the transistors $T_1$ and $T_2$, as will be explained more fully hereinafter.

The current-voltage relation of a MOS transistor can be described on approximation by the equation:

$$I_D = (\beta/2)(W/L)(V_{GS} - V_T)^2 \tag{1}$$

in which $\beta = \mu_n \cdot C_{ox}$ = product of the mobility of the charge carriers and the oxide capacitance, W/L is the width-to-length ratio of the channel, $V_{GS}$ is the voltage difference between gate and source and $V_T$ is the threshold voltage of the transistor (see, for example: Szé "Physics of Semiconductor devices", second Ed., Wiley and Sons, New York, 1981, more particularly page 442). Specific values in usual MOS processes are: of the threshold voltage $V_T$ 1 V, and for ($\beta/2$) about 20 $\mu A/V^2$. When the W/L ratio for the transistor $T_1$ is chosen = 1, the equation (1) can be rewritten for $T_1$ as $$I_D = 20(V_{GS} - 1)^2 = 20(5 - 1 - V_{27})^2 = 20(4 - V_{27})^2,$$

in which $V_{27}$ is the voltage at the junction 27. When a W/L ratio of (1/10) is chosen for the transistor $T_2$, it holds, starting from the equation (1), for the transistor $T_2$ that:

$$I_D = 20 \cdot (1/10)(V_{27} - 1)^2,$$

it being assumed that $T_1$ and $T_2$ both have a threshold voltage of 1 V. Since an equally large current flows through both transistors, it follows that $$(1/10)(V_{27} - 1)^2 = (4 - V_{27})^2.$$

A value of about 3,1 V follows therefrom for $V_{27}$. The current then flowing through $T_1$ and $T_2$ is about 20 μA. This value is sufficiently large to reset the zone 7 and is also sufficiently large to be able to drain capacitive cross-talk.

Via the connection 23, instead of 5 V a lower voltage of about 3 V is therefore applied to a drain zone 14 and hence to the reading zone 7, as a result of which a voltage of 5 V equal to the supply voltage can be applied to the gate 13 in order to reset the zone 7. In order to illustrate this, FIG. 2 shows a diagram of potentials occurring during operation at the surface 2 of the substrate 1. The positive potential is plotted in downward direction, as is usual in the technical literature. FIG. 2 illustrates the situation in which the voltage of 5 V is applied to the clock electrode 3($\phi_2$) and the voltage of 0 V is applied to the clock electrode 4($\phi_3$). Below the clock electrode 3 a potential well is formed, in which a charge packet 29 is stored. Below the clock electrode 4($\phi_1$) a potential barrier 30 is formed. The charge packet 29 can be shifted, as is known, by one position by applying to the clock electrode 4 the voltage 5 V and to the clock electrode 3 the voltage 0 V. The fixed voltage $V_{27}$ of about 3 V is applied to the blocking gate 16. As a result, below the electrode 16 the potential 31 is induced, which is such that, when $\phi_1$ passes from 5 V to 0 V, the charge stored below the clock electrode 4 flows to the reading zone 7 across the potential levels 31. The potential level 32 of the reading zone is equal to the potential at the junction 27 when no charge packet is present. There can be stored in the potential well 32 a charge packet 33, which of course must not be so large that the charge is partly stored below the electrode 16, as a result of which a correct reading of the packet becomes impossible. On the righthand side, the charge packet 33 is limited by the potential barrier 34, which is formed when a voltage of 0 V is applied to the gate electrode 13 of the reset transistor. After reading, the voltge of 5 V equal to the supply voltage is applied to the gate electrode 13 of the reset transistor and this voltage corresponds to the potential level 35. It if is assumd that the threshold voltage of the reset transistor 7, 13, 14 is equal to the threshold voltage of the transistor $T_1$ and hence is also equal to 1 V, it will be appreciated that the voltage of 5 V at the gate electrode 13, which voltage is equal to the gate voltage at the gate electrode 21 of $T_1$, is sufficient to guarantee that the reset transistor is closed (conducting) so that the charge packet 33 is drained. The reset transistor remains conducting until the voltage level in the zone 7 is equal to the voltage at the zone 14, i.e. the voltage at the source 22 of the —conducting—transistor $T_1$.

In the embodiment described herein, the voltage of the gate 27 (source 22 of $T_1$) is also applied to the blocking gate 16a, 16. When a charge packet is transferred from the region below the clock electrode 3 to the region below the clock electrode 4, the potential well below the clock electrode 3 and the potential barrier below the clock electrode 4 are raised and reduced, respectively. There is a possibility, when the supply voltages are largely exceeded at marginal threshold voltages, that a certain amount of charge from the charge packet to be transferred via the barrier 31 is lost prematurely via the reset transistor. FIG. 3 shows a simple method of solving this problem. In principle, the solution consists in that the part 16b of the blocking gate 16 is no longer applied together with the part 16a to a fixed potential, but that only the part 16a located beside the zone 7 is applied to a fixed potential, while a varying voltage is applied to the part 16b. This varying voltage is chosen so that, when the voltages at the clock electrodes are varied, a potential barrier is present below the part 16b, which barrier prevents the said loss of charge. In a simple embodiment shown in FIG. 3, the electrode part 16b has applied to it a clock voltage which has the same voltage levels of 0 and 5 V as the clock voltage $\phi_2$ and is in phase opposition to $\phi_r$. In FIG. 3, this is indicated symbolically by the inverter 37 (inverter circuit). FIG. 4 shows a diagram of the clock voltages $\phi_1$ and $\phi_2$ and the reset clock voltage $\phi_r$ and the clock voltage $\bar{\phi}_r$ applied to the blocking gate 16b as a function of the time t. At the instant $t_1$ at which $\phi_1$ passes from 5 V to 0 V and $\phi_2$ passes from 0 V to 5 V, $\bar{\phi}_r$ passes from 5 V to 0 V, as a result of which a potential barrier is formed below the electrode part 16b. When $\phi_2$ is at 5 V and a potential well is formed below the electrode 4, $\bar{\phi}_r$ can return to 5 V.

it will be appreciated that the invention is not limited to the embodiments shown herein, but that many further modifications are possible for those skilled in the art without departing from the scope of the invention. For example, instead of the transistor $T_2$, a current source may alternatively be used in the circuit 18.

In the embodiments described, the reset transistor is provided with a single gate electrode. Advantageously, however, the reset transistor may also be provided with two gate electrodes in order to reduce clock cross-talk.

What is claimed is:

1. A charge transfer device comprising a semiconductor body, at a surface of which is defined a charge transport channel for storing and transporting information in the form of discrete charge packets to an output stage, which has a zone for temporarily storing and reading the charge packets and an insulated gate field effect transistor which forms a reset transistor draining a read charge packet and preparing the said zone for storing and reading a next charge packet, this transistor comprising a source region coupled to the said zone, an insulated gate connected to a clock voltage source for rendering the transistor intermittently conducting and non-conducting, and a drain region connected to means for applying a suitable drain voltage, characterized in that the said means comprise a second insulated gate field effect transistor, which is designated hereinafter as auxiliary transistor, whose gate and drain can be applied to a fixed voltage $V_1$, more particularly the supply voltage, and whose source is connected to the drain region of the reset transistor and to current supply means for passing a current through the auxiliary transistor, and in that the gate of the reset transistor is connected to a clock voltage source, by means of which in the conductive state of the reset transistor, the voltage $V_1$ is also applied to the gate of the reset transistor.

2. A charge transfer device as claimed in claim 1, characterized in that the reset transistor and the auxiliary transistor have channel regions of substantially the same dimensions.

3. A charge transfer device as claimed in claim 1, characterized in that the said current supply means comprise a third insulated gate field effect transistor, whose gate electrode and whose drain are connected in common to the source of the auxiliary transistor, while the source of the third transistor can be applied to a fixed voltage.

4. A charge transfer device as claimed in claim 3, characterized in that the third field effect transistor has substantially the same threshold voltage as the auxiliary transistor.

5. A charge transfer device as claimed in claim 1, characterized in that above the charge transport channel and, viewed in the charge transport direction, in front of the said zone of the output stage there is arranged an insulated gate electrode, which is connected to the source of the auxiliary field effect transistor.

* * * * *